United States Patent
Ehlen et al.

(10) Patent No.: US 10,356,927 B2
(45) Date of Patent: Jul. 16, 2019

(54) STORAGE CARD ADAPTER WITH COMPRESSION LATCH

(71) Applicant: Facebook, Inc., Menlo Park, CA (US)

(72) Inventors: Jon Brian Ehlen, Newark, CA (US); Melody Grace Liu, Princeton, NJ (US)

(73) Assignee: Facebook, Inc., Menlo Park, CA (US)

( * ) Notice: Subject to any disclaimer, the term of this patent is extended or adjusted under 35 U.S.C. 154(b) by 44 days.

(21) Appl. No.: 15/666,438

(22) Filed: Aug. 1, 2017

(65) Prior Publication Data
US 2019/0045651 A1     Feb. 7, 2019

(51) Int. Cl.
| | | |
|---|---|---|
| *H05K 7/14* | (2006.01) | |
| *E05B 13/00* | (2006.01) | |
| *E05C 3/00* | (2006.01) | |
| *E05C 19/00* | (2006.01) | |
| *E05C 3/04* | (2006.01) | |
| *E05B 65/00* | (2006.01) | |
| *H05K 7/20* | (2006.01) | |

(52) U.S. Cl.
CPC ......... *H05K 7/1427* (2013.01); *E05B 13/002* (2013.01); *E05B 65/006* (2013.01); *E05C 3/004* (2013.01); *E05C 3/042* (2013.01); *E05C 19/007* (2013.01); *H05K 7/2039* (2013.01)

(58) Field of Classification Search
None
See application file for complete search history.

(56) References Cited

U.S. PATENT DOCUMENTS

| | | | | |
|---|---|---|---|---|
| 5,484,063 | A | * 1/1996 | Cuccio | G11B 33/025 206/320 |
| 5,531,328 | A | * 7/1996 | Rochelo | H05K 5/0269 206/454 |
| 5,980,294 | A | * 11/1999 | Kanda | G06K 13/0843 361/679.32 |
| 5,986,891 | A | * 11/1999 | Sugimoto | H01R 12/714 361/736 |
| D436,314 | S | * 1/2001 | Hansen | D9/422 |

(Continued)

OTHER PUBLICATIONS

U.S. Appl. No. 15/683,724 by Ehlen, J., et al., filed Aug. 22, 2017.

*Primary Examiner* — Xanthia C Cunningham
(74) *Attorney, Agent, or Firm* — FisherBroyles, LLP

(57) ABSTRACT

Technology is provided for a storage card adapter. The storage card adapter is used for housing storage cards (e.g., M.2 storage cards), and the storage card adapter can then be inserted into a drive bay. The storage card adapter includes a compression latch system that, when engaged, brings together the cover and carrier frame of the storage card adapter such that at least 100 lbs of compressive force is applied to thermal pads disposed on either side of storage cards housed within the storage card adapter. The compression latch system includes a cam into which a shaft of a compression latch is inserted. When a lever attached to one end of the shaft is pivoted about the shaft, a ramp on the opposite end of the shaft engages with an engagement ramp within the cam to thereby pull together the cover and carrier frame and provide the desired compressive force to the thermal pads. The storage card adapter also includes a spring latch that locks the lever of the compression latch into place when the compression latch is fully engaged with the cam.

20 Claims, 9 Drawing Sheets

(56) References Cited

U.S. PATENT DOCUMENTS

| | | | | |
|---|---|---|---|---|
| 6,174,188 B1* | 1/2001 | Martucci | G06K 7/0021 | 439/326 |
| 6,193,069 B1* | 2/2001 | Guenther | H05K 13/0084 | 206/706 |
| 6,887,090 B2* | 5/2005 | Lin | H05K 7/1007 | 439/259 |
| 7,118,419 B1* | 10/2006 | Lee | G06K 7/0021 | 439/630 |
| 7,161,811 B2* | 1/2007 | Richter | G06K 13/0862 | 361/737 |
| 7,494,195 B2* | 2/2009 | Han | H02G 3/081 | 312/223.2 |
| 8,023,259 B2* | 9/2011 | Lam | G06F 1/1616 | 292/253 |
| 8,464,873 B2* | 6/2013 | Uchida | B65D 81/36 | 206/722 |
| 9,122,458 B2* | 9/2015 | Yu | G06F 1/185 | |
| 9,122,970 B2* | 9/2015 | Huang | H01R 12/716 | |
| 9,176,546 B2* | 11/2015 | Chen | G06F 1/187 | |
| 9,282,658 B1* | 3/2016 | Tsai | G11B 33/124 | |
| 9,911,464 B2* | 3/2018 | Jau | G06F 1/187 | |
| 2002/0085345 A1* | 7/2002 | Chen | G06F 1/184 | 361/679.33 |
| 2003/0151332 A1* | 8/2003 | Chen | G06F 1/181 | 312/223.2 |
| 2009/0316350 A1* | 12/2009 | Hu | H05K 5/03 | 361/679.33 |
| 2010/0091443 A1* | 4/2010 | Lam | G06F 1/1616 | 361/679.33 |
| 2010/0096522 A1* | 4/2010 | Tsai | G06F 1/187 | 248/217.4 |
| 2010/0097912 A1* | 4/2010 | Lin | G11B 33/124 | 369/75.11 |
| 2011/0049319 A1* | 3/2011 | Peng | G06F 1/187 | 248/309.1 |
| 2011/0310552 A1* | 12/2011 | Huang | G06F 1/187 | 361/679.37 |
| 2012/0218705 A1* | 8/2012 | Huang | G06F 1/187 | 361/679.37 |
| 2014/0077676 A1* | 3/2014 | Lu | G11B 33/027 | 312/326 |
| 2016/0054767 A1* | 2/2016 | Chen | G06F 1/1658 | 361/679.39 |

* cited by examiner

US 10,356,927 B2

STORAGE CARD ADAPTER WITH COMPRESSION LATCH

TECHNICAL FIELD

This patent application is directed to storage card adapters, and more specifically to storage card adapters having a compression latch system.

BACKGROUND

Storage card adapters are useful for securely housing a printed circuit board (PCB) having a plurality of storage cards connected thereto and providing a mechanism for easily connecting the PCB and associated storage cards into a drive bay. Some storage card adapters are used for housing a PCB and a plurality of M.2 storage cards.

When M.2 storage cards are housed within a storage card adapter, a problem commonly faced is the heat given off by the plurality of M.2 storage cards. In order to cool the interior space of the storage card adapter, many different features can be provided. For example, storage card adapters are typically provided with heat sinks, heat fins, and various other geometries specifically designed to draw heat away from the M.2 storage cards and out of the storage card adapter.

Another feature that is sometimes used to cool storage cards within a storage card adapter are thermal pads. Thermal pads generally reside directly against the top and bottom surfaces of M.2 storage cards housed inside of a storage card adapter. This direct contact helps to draw heat away from the storage cards. It is known that thermal pads are generally more efficient at drawing heat away from storage cards when they are pressed firmly against the M.2 storage cards. However, it is sometimes difficult to achieve a desired amount of compressive force on the thermal pads using conventional storage card adapters. It can also sometimes be difficult and uncomfortable for a user to accomplish the desired amount of compressive force using previously known mechanisms for securing a cover to a carrier frame of a storage card adapter to thereby achieve the desired compressive forces. Accordingly, a need currently exists for a storage card adapter that is capable of applying a high amount of compressive force on thermal pads housed within the storage card adapter and that is also easy for a user to apply the compressive force.

BRIEF DESCRIPTION OF THE DRAWINGS

Embodiments of the storage card adapters disclosed herein may be better understood by referring to the following Detailed Description in conjunction with the accompanying drawings, in which like reference numerals indicate identical or functionally similar elements.

Figure 1:
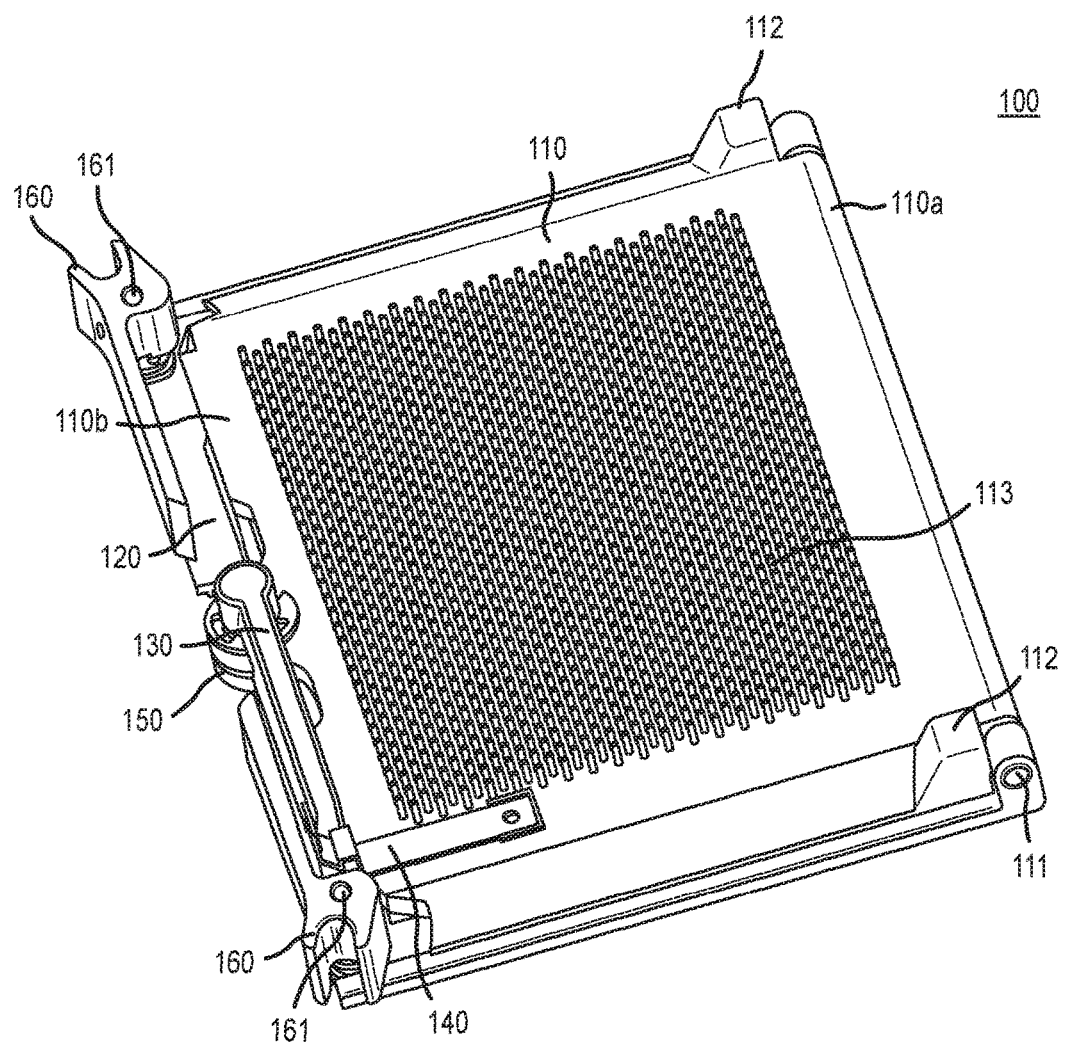
FIG. 1 is an isometric view of a storage card adapter according to a representative embodiment.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

A storage card adapter with a compression latch is disclosed. The storage card adapter houses a plurality of storage cards (e.g., M.2 storage cards), each of which is sandwiched between two thermal pads. The compression latch of the disclosed storage card adapter ensures that sufficient compressive force is applied to the sandwich of thermal pads and storage card to thereby enhance the efficiency of the thermal pads in drawing heat away from the storage card.

In an embodiment, the storage card adapter includes a carrier frame and a cover pivotably attached to the carrier frame so that the cover can be moved back and forth between an open configuration (i.e., a configuration in which a PCB may be placed in the carrier frame) and a closed configuration (i.e., a configuration in which the cover encloses the interior of the carrier frame, including a PCB disposed therein). The carrier frame includes at least one cam located on an end side of the carrier frame opposite from the end side of the carrier frame to which the cover is pivotably attached. The cam includes a recess and a mating ramp. The cover includes an aperture at the end side of the cover opposite from the end side of the cover that is pivotably attached to the carrier frame. Through the aperture extends a shaft of a compression latch. At the lower end of the shaft is an engagement ramp configured to engage with the mating ramp of the cam. At the opposite end of the shaft and on the other side of the aperture then the engagement ramp is an elongated lever extending perpendicular to the shaft. When the lower end of the shaft with the engagement ramp is inserted into the recess in the cam, pivoting of the elongated lever about the shaft causes the engagement of the engagement ramp with the mating ramp and draws the cover and carrier frame closer together. The cover, carrier frame, cam and compression latch are dimensioned such that engagement of the engagement ramp with the mating ramp brings together the cover and carrier frame to a distance that will apply the desired compressive force to the sandwich of thermal pads and storage cards housed within the storage card adapter.

In another embodiment, the cam and compression latch are replaced with an alternate latching system. The carrier frame includes a hook proximate an end side of the carrier frame opposite from the end side of the carrier frame to which the cover is pivotably attached. The cover includes a latch at the end side of the cover opposite from the end side of the cover that is pivotably attached to the carrier frame. The latch includes a ledge configured to engage with the hook. The cover, carrier frame, hook and latch are dimensioned such that engagement of the latch with the hook brings together the cover and carrier frame to a distance that will apply the desired compressive force to the sandwich of thermal pads and storage cards housed within the storage card adapter.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description. The terminology used below is to be interpreted in its broadest reasonable manner, even though it is being used in conjunction with a detailed description of some specific examples of the embodiments.

FIG. 1 illustrates a storage card adapter 100 according to a representative embodiment. The overall dimensions of the storage card adapter 100 are selected such that the storage card adapter 100 has an envelope compatible with a drive bay into which the storage card adapter 100 can be inserted. For example, in the depicted embodiment, the storage card adapter 100 has an envelope compatible with a drive bay configured to receive a 3.5 inch hard drive.

The storage card adapter 100 includes a cover 110 and a carrier frame 120. The cover 110 is pivotably attached to the carrier frame 120 at a first end side 110a of the cover 110. The cover 110 can be pivotably attached to the carrier frame 120 using, for example, a pair of knurled pins 111 that extend through aligned apertures in the carrier frame 120 and the cover 110 as shown in FIG. 1. Other structures for pivotably attaching the cover 110 to the carrier frame 120 can also be used. In some embodiments, the cover 110 is pivotably attached to the carrier frame 120 in a manner that allows for the cover 110 to pivot from a configuration where the cover 110 is over the carrier frame 120 and aligned in parallel with the carrier frame 120 (i.e., a closed position) to an open position where the cover 110 is next to the carrier frame 120 and aligned in parallel with the carrier frame (i.e., an approximately 180° pivot). The cover 110 may also be provided with stop pedestals 112 that prevent the cover 110 from pivoting beyond approximately 180° when the storage card adapter 100 is laid flat on a surface.

The manner in which the cover 110 is pivotably attached to the carrier frame 120 maintains a gap a between the cover 110 and the carrier frame 120 when the cover 110 is in the closed positioned on top of the carrier frame 120. The cover 110 and the frame 120 otherwise have roughly the same length and width dimensions so that when the cover 110 is in the closed positioned as shown in FIG. 1, the cover 110 and the carrier frame 120 enclose the gap between the cover 110 and the carrier frame 120. As discussed in greater detail below, a printed circuit board 170 (FIG. 3) having storage cards 180 (FIG. 3) connected thereto can be housed within this enclosed interior space.

Figure 3:
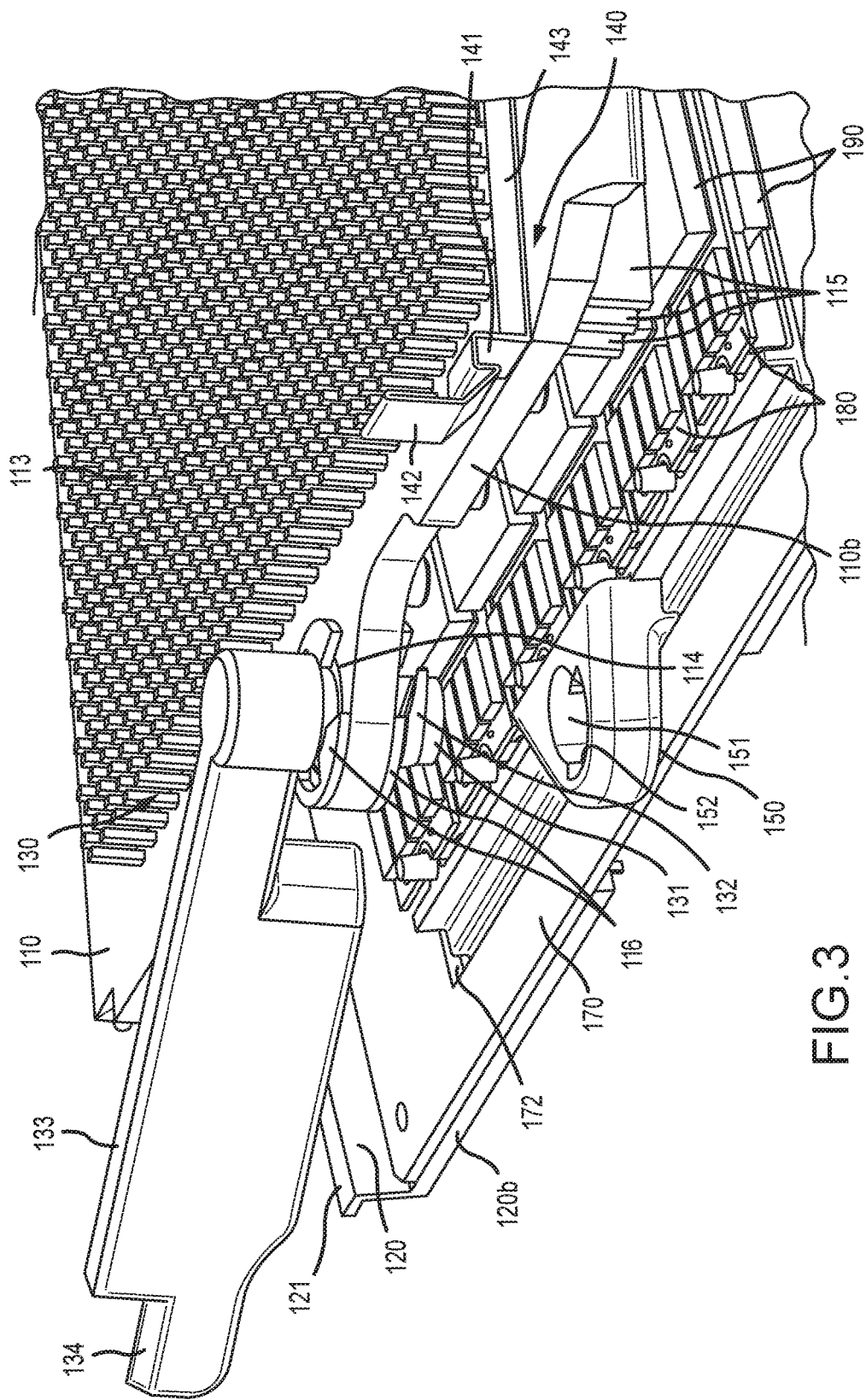
FIG. 3 is an isometric view of the latch system of the storage card adapter shown in FIG. 1.

At the end side 110b opposite the end side 110a, the cover 110 includes a compression latch 130 (discussed below in greater detail with respect to FIG. 3) and a spring latch 140 (discussed below in greater detail with respect to FIG. 4). Briefly, the compression latch 130 engages with a cam 150 provided on the carrier frame 120 to bring together the cover 110 and the carrier frame 120 (i.e., to decrease the distance between the cover 110 and the carrier frame 120). The storage card adapter 100 of the illustrated embodiment has at least one thermal pad 190. When a storage card 180 (FIG. 3) is positioned between two thermal pads 190 (FIG. 3) and housed within the storage card adapter 100, the engagement of the compression latch 130 with the cam 150 to bring together the cover 110 and the carrier frame 120 applies compression force to the thermal pads 190 (FIG. 3) and increases the efficiency of the thermal pads 190 (FIG. 3) to draw heat away from the storage cards 180 (FIG. 3).

In addition to the cam 150, the carrier frame 120 can also optionally include card guide levers 160 at the side end 120b (FIG. 2) opposite the side end 120a (FIG. 2) that is pivotably attached to the cover 110. The card guide levers 160 pivot about pins 161 and can be used to make insertion and removal of the storage card adapter 100 into and out of a drive bay easier. The carrier frame 120 can further include flanged storage card adapter guides 121 (FIG. 3) at the lateral sides of the carrier frame 120. The flanged storage card adapter guides 121 help to guide the storage card adapter 100 into and out of a drive bay.

The exterior surface of the cover 110 can include a heat sink 113 to further assist with directing heat away from the storage card adapter 100. While FIG. 1 shows a plurality of pins for the heat sink 113, other heat sink configurations can also be used, such as fins. The thermal pads 190 are mounted on a surface of the heat sink 113 opposite the pins, such that the heat sink thermally communicates with the respective thermal pad to efficiently and effectively draw heat away from the storage card captured between the carrier frame 120 and the cover 110. Other structures for directing heat away from the storage card adapter 100 can also be provided on the cover 110. For example, heat fins 115 (FIG. 3) can be provided on the interior surface of the cover 110 towards the lateral sides of the cover 110.

Because the storage card adapter 100 is subjected to high levels of heat emanating from the storage cards 180 (FIG. 3) housed therein, the material of the cover 110 is preferably a material capable of withstanding high temperatures. In some embodiments, the cover 110, the carrier frame 120, the compression latch 130 and the spring latch 140 can all be made of a metal material, such as die cast aluminum, so that these components can withstand the high temperatures experienced by the storage card adapter 100.

Figure 2:
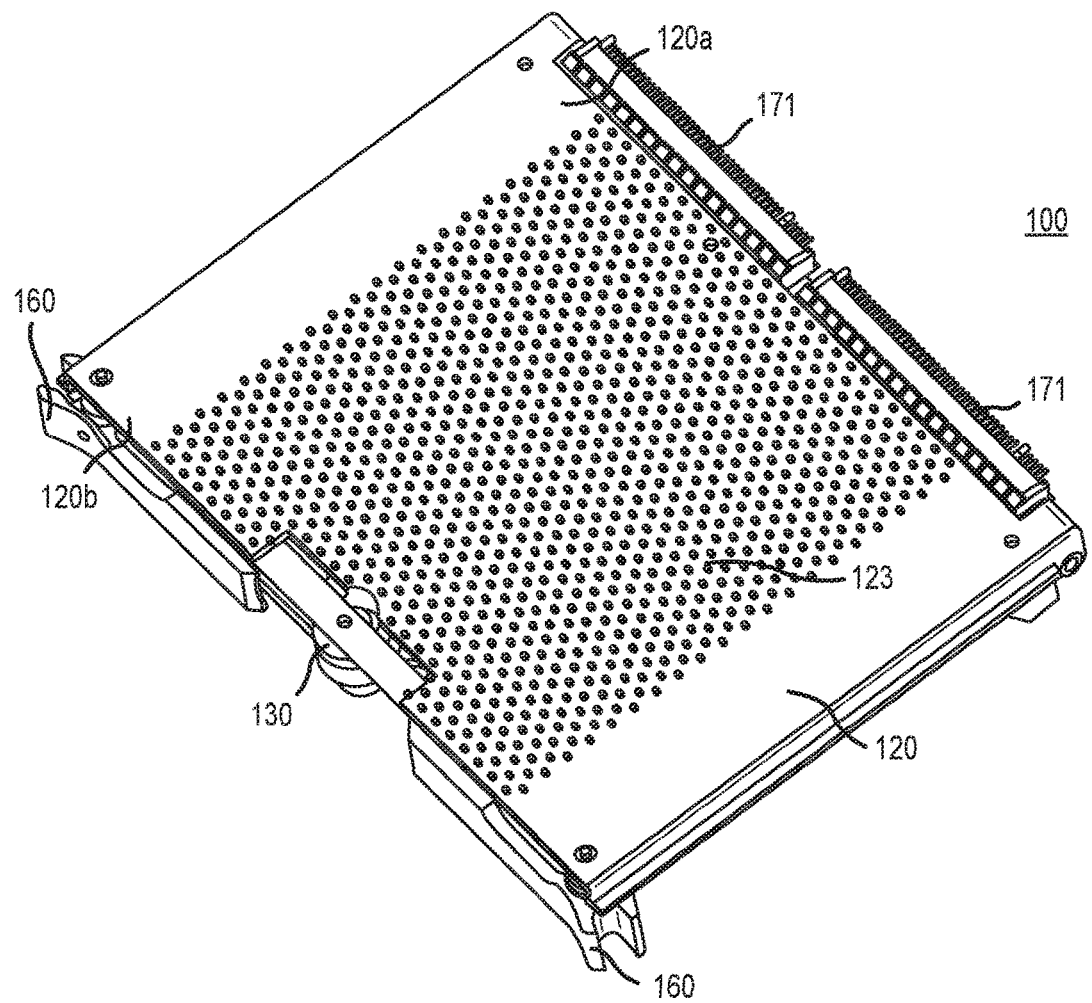
FIG. 2 is an isometric view of the bottom of the storage card adapter shown in FIG. 1

FIG. 2 provides a bottom view of the storage card adapter 100 shown in FIG. 1, i.e., where the carrier frame 120 is shown on top. The cam 130 proximate the side end 120b is also seen more clearly in FIG. 2. As with the cover 110, the carrier frame 120 can include a heat sink 121 on its exterior surface. While pins are shown for the heat sink 123 in FIG. 2, other types of heat sinks can be used.

FIG. 2 illustrates how a portion of the PCB 170 (FIG. 3) housed within the storage card adapter 100 is accessible through the side end 120b of the carrier frame 120. Specifically, PCB connectors 171 are accessible from the side end 120a of the carrier frame 120 such that when the storage card adapter 100 is inserted into a drive bay, the connectors 171 can connect with the drive bay.

FIG. 3 provides an enlarged view of the compression latch 130, the snap latch 140 and the cam 150, as well as a view of how the PCB 170, the storage cards 180 and the thermal pads 190 are housed within the storage card adapter 100. The cover 110 includes an aperture 114 at the side end 110*b*. A portion of the compression latch 130 extends through this aperture 114 and snap rings 116 can be used to retain the compression latch 130 in the aperture 114. More specifically, the compression latch 130 includes a shaft 131 that passes through the aperture 114. An engagement ramp 132 is provided at one end of the shaft 131, with the engagement ramp 132 designed for engagement with the cam 150 as described in greater detail below. At the opposite end of the shaft 131, the compression latch 130 includes an elongated lever 133 oriented generally perpendicular to the shaft 131. Movement of the lever 133 about its pivot point (i.e., the shaft 131) causes the engagement ramp 132 to rotate.

The carrier frame 120 includes the cam 150 at the side end 120*b* of the carrier frame 120. The cam 150 includes a recess 151 configured to receive the shaft 131. The recess 151 includes a mating ramp 152 that is configured to receive the engagement ramp on the shaft 131.

In order for the cam 150 and compression latch 130 to work together properly, the shaft 131 must be positioned so that the engagement ramp 132 aligns with the top of the mating ramp 152 so as to be receivable into the top of the mating ramp 152. If these two components are not aligned, the recess 151 will not be able to receive the shaft 131. In some embodiments, the engagement ramp 152 is positioned on the shaft 151 such that the engagement ramp 152 properly aligns with the top of the mating ramp 152 when the lever 133 is in a position parallel to the side end 110*b* of the cover 110. When in this position, the engagement ramp 132 fits into the top part of the mating ramp 152. However, in order for the shaft 131 to be drawn further into the recess 151, the engagement ramp 132 needs to be rotated so that it can follow down the mating ramp 152. To accomplish this, the lever 133 is pivoted about its pivot point (i.e., the shaft 131), which causes the engagement ramp 132 to rotate and be guided down into the recess 151 via the mating ramp 152. This movement of the shaft 131 down into the recess 151 causes the cover 110 and the carrier frame 120 to be pulled closer together. In some embodiments, rotation of the lever 133 180° to where the lever 133 is again aligned in parallel with the end side 110*b* of the cover 110 results in full engagement of the compression latch 130 into the cam 150 and represents the closest the cover 110 and the carrier frame 120 can be brought together using the compression latch 130.

Figure 4:
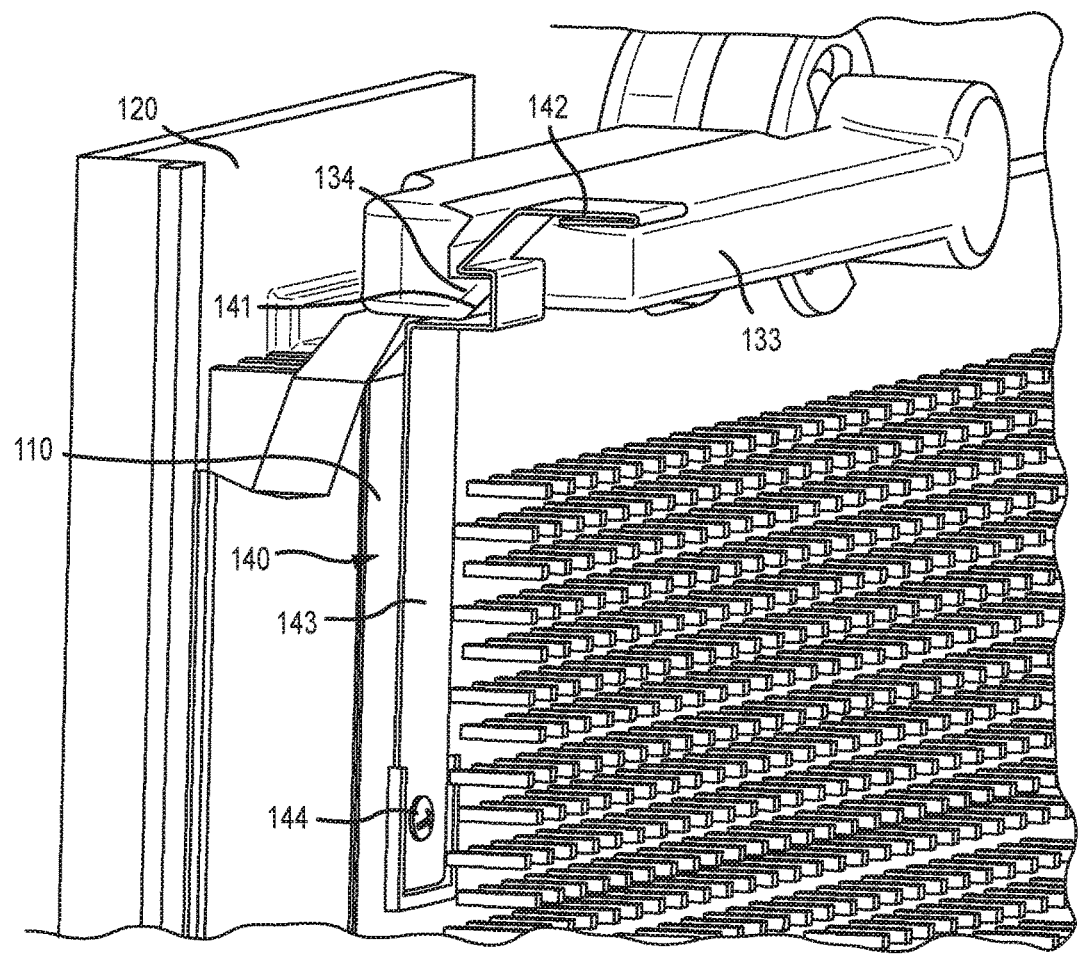
FIG. 4 is an isometric view of a spring latch system of the storage card adapter shown in FIG. 1.

With reference to FIGS. 3 and 4, when the lever 133 is rotated a full 180°, the spring latch 140 may engage the lever 133 and prevent pivoting of the lever 133 back towards the unlatched positioned. The spring latch 140 can therefore include a recess 141 that is sized to receive the lever 133. In some embodiments, the end of the lever 133 includes a tab 134, and the width of the recess 141 is approximately equal to the width of the tab 134 so that the recess 141 receives the tab to lock the lever 133 in place. The spring latch 140 is positioned on the exterior surface of the cover 110 so that the recess 141 is located at the side end 110*b*. This helps to ensure that the spring latch 140 engages the lever 133 only when the lever 133 has rotated all the way to the position parallel with the side end 110*b* of the cover 110. The spring latch 140 can also include a release tab 142 for use in releasing the lever 133 from the spring latch 140. More specifically, when the release tab 142 is pressed or pulled back towards the storage card adapter 100, the recess 141 is lifted up slightly to thereby release the lever 133 from the recess 141. A base portion 143 of the spring latch 140 extends back along the cover 110 and can be anchored to the cover 110 by, for example, a screw 144 (FIG. 4). Other structures for securing the spring latch 140 to the cover 110 can also be used.

Referring back to FIG. 3, the PCB 170 is shown resting in the carrier frame 120. The PCB 170 includes an opening 172 through which the cam 150 extends. The opening 172 in the PCB 170 also provides room for the thermal pads 190 to be stacked under and on top of each of the storage cards 180. The cover 110 is slightly open as shown in FIG. 3 and the compression latch 130 has not yet been engaged with the cam 150. However, once the cover 110 is closed on top of the carrier frame 120 and the compression latch 130 is engaged with the cam 150, the interior surfaces of the cover 110 and the carrier frame 120 are brought closer together, at which point they engage the top and bottom thermal pads 190 and compress them towards the storage cards 180. When pressed against the storage cards 180 in this manner, the thermal pads 190 can more efficiently transfer heat away from the storage cards 180. In some embodiments, all relevant components of the storage card adapter 100 are dimensioned so that when the compression latch 130 is fully engaged with the cam 150, the cover 110 and the carrier frame 120 exert at least 100 lbs of compression force on the stack of the thermal pads 190 and the storage card 180. However, the design of the compression latch 130 and cam 150 means that a user need apply only a fraction of this force on the lever 133 in order to achieve the 100 lbs or more of compression force. This means the disclosed storage card adapter 100 is easier and less uncomfortable to use while still achieving the desired compression force.

The storage card adapter 100 of FIG. 3 is shown housing six M.2 storage cards 180, with each storage card 180 being disposed between a pair of thermal pads 190. However, it should be appreciated that the storage card adapter 100 can be used to house fewer or more than six M.2 storage cards, as well as other types of storage cards.

Figure 5:
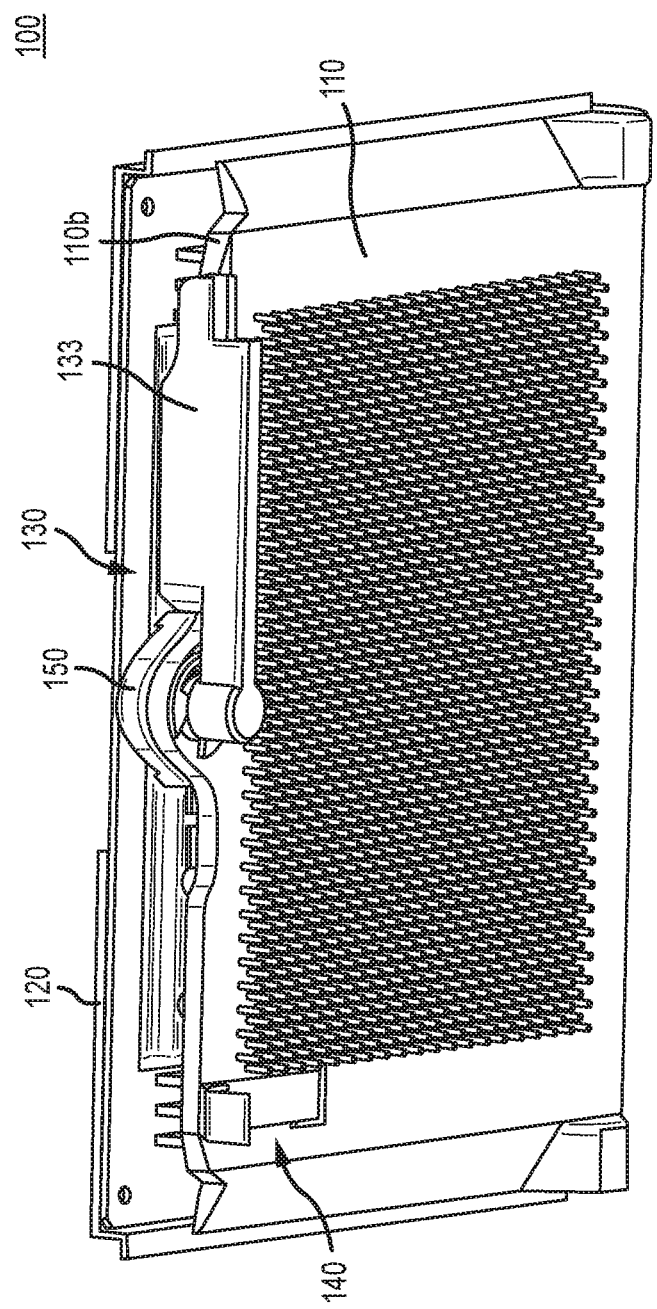
FIG. 5 is an isometric view of the storage card adapter shown in FIG. 1 in an unlatched position.
Figure 6:
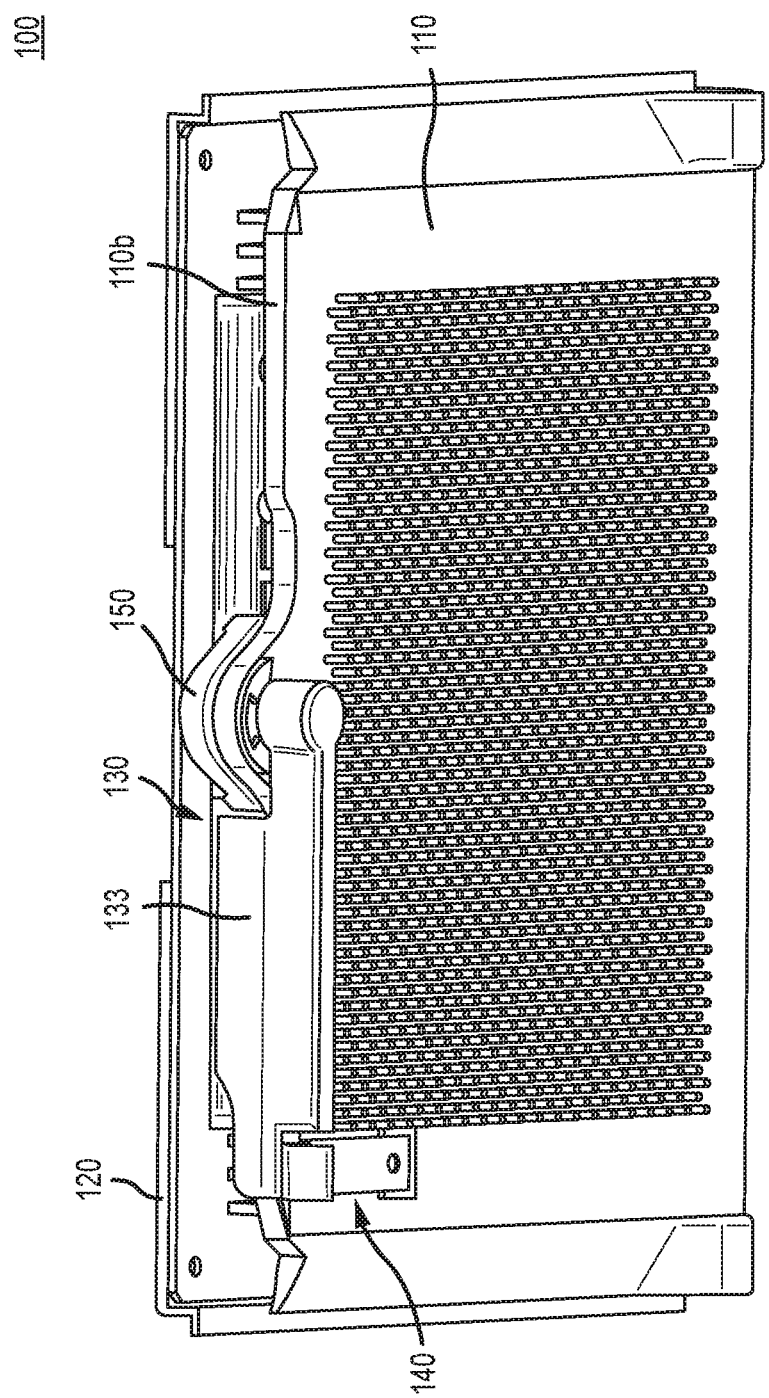
FIG. 6 is an isometric view of the storage card adapter shown in FIG. 1 in a latched position.

FIGS. 5 and 6 provide another illustration of how the compression latch 130 engages with the cam 150 via pivoting of the lever 133 along a 180° path. In FIG. 5, the storage card adapter 100 is in an open or unlatched configuration. The lever 133 is aligned in parallel with the end side 110*b* of the cover 110, meaning the engagement ramp 132 (FIG. 3) is aligned with the top of the mating ramp 152 (FIG. 3). In FIG. 6, the lever 133 has been pivoted 180° to a closed or latched configuration. The lever 133 is again aligned in parallel with the end side 110*b* of the cover 110, though at the other side of the cover 110. As the lever 133 was pivoted through this 180° path, the engagement ramp 132 (FIG. 3) was drawn down into the recess 151 (FIG. 3) along the mating ramp 152 (FIG. 3), which caused the cover 110 and the carrier frame 120 to be brought closer together and thereby compress against the storage card 180 (FIG. 3) and thermal pad 190 (FIG. 3) stacks housed within the storage card adapter 100. Once the lever 133 is moved to the closed or latched position, the spring latch 140 engages the lever 133 to hold it in place.

In the embodiment discussed above and shown in FIGS. 1-6, the storage card adapter 100 includes a single compression latch 130 and a single cam 150, with the compression latch 130 and the cam 150 being generally centered along the length of the side ends 110*b* and 120*b*, respectively. In alternate embodiments, the storage card adapter 100 can include more than one compression latch 130 and cam 150. For example, the storage card adapter 100 can include two sets of compression latches 130 and cams 150, one located in each corner of the side ends 110b, 120b. The two sets of compression latches 130 and cams 150 operate in the same manner as described above to pull together the cover 110 and the carrier frame 120 so that compressive force is applied to stacks of thermal pads 190 and storage cards 180 housed within the storage card adapter 100.

Figure 7:
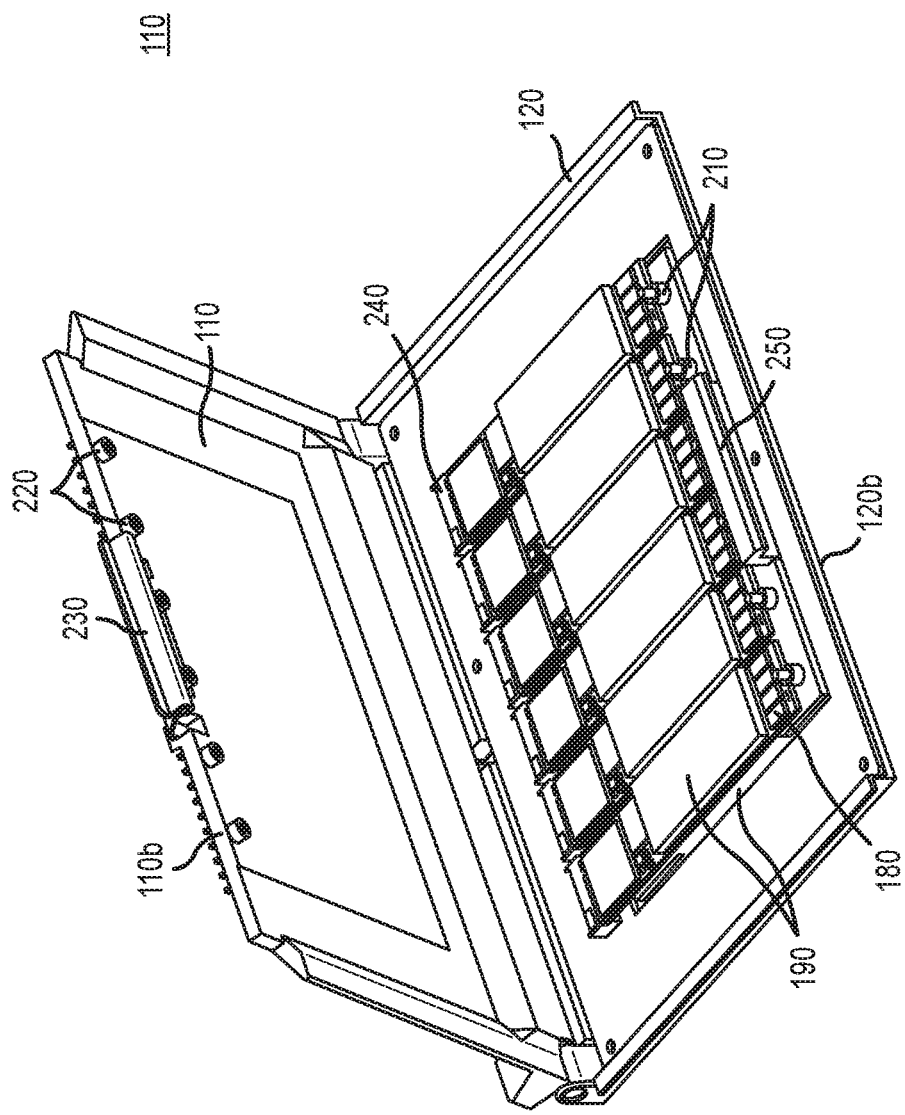
FIG. 7 is an isometric view of a storage card adapter according to another representative embodiment.
Figure 8:
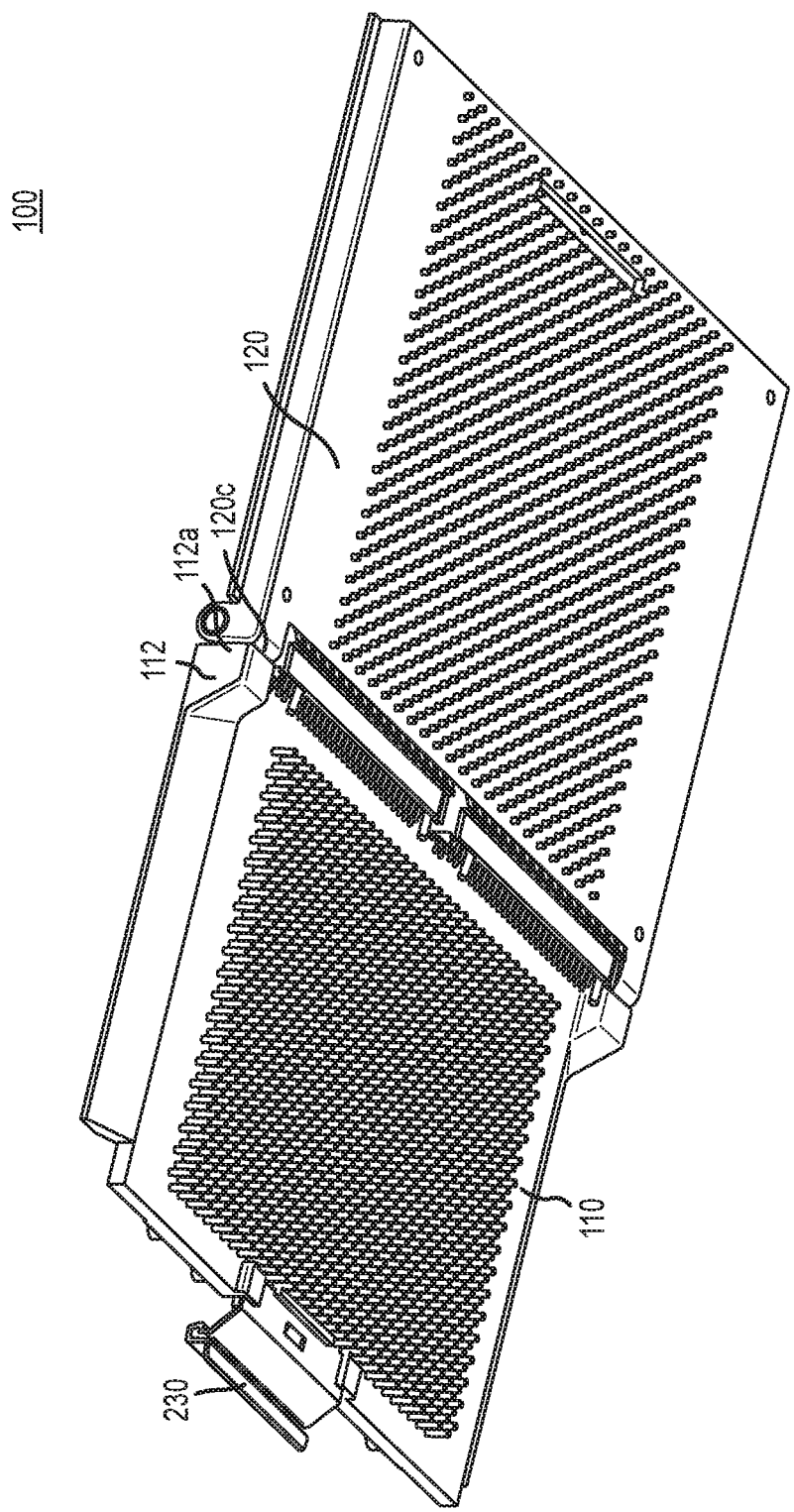
FIG. 8 is an isometric view of the storage card adapter shown in FIG. 7 in an open configuration.
Figure 9:
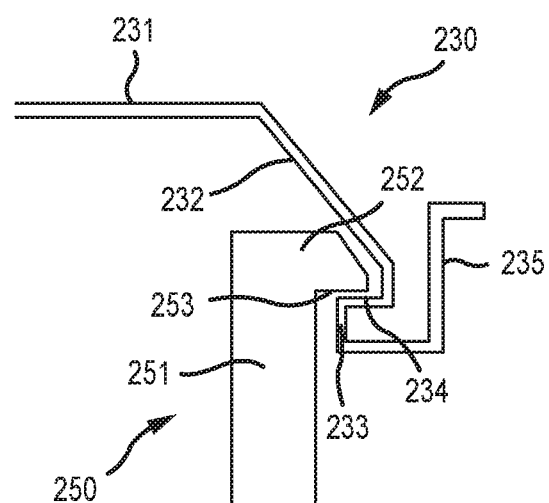
FIG. 9 is a cross-sectional view of the latch and hook of the storage card adapter shown in FIG. 7.

FIGS. 7-9 illustrate another embodiment of a storage card adapter having a compression latch system. Generally speaking, the cover 110 and the carrier frame 120 for this embodiment are similar or identical to the cover 110 and carrier frame 120 described previously and shown in FIGS. 1-6, with the exception that the compression latch 130, the cam 150, and the spring latch 140 have been removed and replaced with an alternate latch system.

In the embodiment shown in FIGS. 7-9, the cover 110 includes a latch 230 and the carrier frame 120 includes a hook 250. When the cover 110 is pivoted down to rest on top of the carrier frame 120, the latch 230 engages the hook 250 to draw together the cover 110 and the carrier frame 120. The latch 230 and the hook 250 are dimensioned so that when the latch 230 is engaged with the hook 250, the cover 110 and the carrier frame 120 apply at least 100 lbs of compressive force on the thermal pads 190 located above and below the storage cards 180.

The latch 230 if formed of a relatively thin sheet of material that is angled at various locations to form different sections of the latch. The material of the latch 230 has a degree of elasticity so that various sections of the latch 230 can be stressed in different directions while still returning to their original positions. With specific reference to FIG. 9, the latch 230 includes a base portion 231 that connects the latch 230 to the cover 110, such as via a snap fit with the cover 110. The base portion 231 is generally aligned in parallel with the cover 110 when connected to the cover 110. At one end of the base portion 231 is an angled portion 232 that angles down towards the carrier frame 120. The latch 230 then includes inwardly protruding section 233 that protrudes back towards the cover 110 and thereby forms an engagement ledge 234. Finally, the latch 230 includes a release tab 235 that can be used to disengage the latch 230 from the hook 250.

The hook 250 is generally integrally formed with the carrier base 120 and can therefore be made from the same material as the carrier base 120. The hook 250 generally includes an upright portion 251 that extends upwards from the interior surface of the carrier frame 120 in a direction perpendicular to the interior surface of the carrier frame 120. At the end of the perpendicular portion 251 is an outwardly protruding portion 252 that forms an engagement ledge 253. In some embodiments, the outwardly protruding portion 252 has a shape that matches the shape formed by the angled portion 232 and the inwardly protruding portion 233 of the latch 230. For example, and as shown in FIG. 9, the hook 250 includes an angled surface on the outwardly protruding portion 252 that conforms to the angled portion 232.

When the latch 230 engages with the hook 250, the angled portion 232 generally deflects upwards as it passes down over the hook 250 so that the engagement ledge 234 of the latch 230 can ultimately engage with the engagement ledge 253 of the hook 250. The resiliency of the latch 230 means that after the inwardly protruding section 233 of the latch 230 passes over the outwardly protruding portion 252 of the hook 250, the angled portion 232 springs back to its original orientation so that the latch 230 is prevented from rising in an upward direction.

To disengage the latch 230 from the hook 250, the release tab 253 is pressed back towards the cover 110. This causes the inwardly protruding portion 233 to move slightly away from the hook 250, at which point the engagement ledge 234 of the latch 230 clears the engagement ledge 253 of the hook 250, and the latch 230 is able to move upward and past the hook 250. Because the latch is formed of a resilient material, the release tab 253 returns to its original orientation after the latch 230 is disengaged from the hook 250 and force is no longer applied to the release tab 253.

The storage card adapter 100 shown in FIGS. 7 and 8 includes only a single latch 230 and a single hook 250, both of which are centered on the side end 110b, 120b, respectively. However, the storage card adapter 100 can include multiple sets of latches 230 and hooks 250, such as where a latch 230 and hook 250 are provided at both corners of the end side 110b and the end side 120b, respectively.

With reference to FIG. 7, guide posts 210 and clamping posts 220 can be provided to support and secure the storage cards 180. The guide posts 210 are provided proximate the end side 120b of the carrier frame 120 and are located relative to the storage card connectors 240 such that when a storage card 180 is inserted in the storage card connector 240, the opposite end of the storage card 180 rests on a ledge provided on the guide post 220. The clamping posts 220 are provided proximate the end side 110b of the cover 110 and each clamping post 220 is aligned with a respective guide post 210. The clamping posts 220 may include a recess in which a distal end of the corresponding guide post 210 can be received. The guide posts 210 and the clamping posts 220 are dimensioned such that when the cover 110 is closed on top of the carrier frame 120, the distal end of the storage cards 180 are clamped between the guide posts 210 and the clamping posts 220. In some embodiments, the guide posts 210 and the clamping posts 220 can also be dimensioned to serve as a stop that prevents over compression that might occur if the cover 110 and carrier frame 120 are brought to close together. The guide posts 210 and the clamping posts 220 can also be provided in the embodiment of the storage card adapter 100 shown in FIGS. 1-6.

With reference to FIG. 8, the storage card adapter is shown in an open position where the cover 110 has pivoted 180° degrees from the closed position where the cover 110 is resting on top of the carrier frame 120. The stop pedestals 112 prevent the cover 110 from pivoting beyond 180° by providing a vertical surface 112a connected to the cover 110 that contacts a vertical back surface 120c of the carrier frame 120 and prevents any further pivoting of the cover 110 beyond 180°. The stop pedestals 112 are also shown in, e.g., FIG. 1 and can thus also be used in the embodiment of the storage card adapter 100 shown in FIGS. 1-6.

The above described adapters are suitable for use when housing storage cards requiring heat dissipation in a storage card adapter. The storage card adapters are especially well suited for use with housing and cooling M.2 storage cards. As described in detail above, the configuration of the storage card adapters herein provides for compressing thermal pads against storage cards housed in a storage card adapter to thereby enhance the efficiency of the thermal pads in transferring heat away from the storage cards and out of the storage card adapter. The compression latch systems ensure that a sufficient amount of compressive force is provided while providing an easy to use latch system that minimizes the amount of force needed to engage the latch system.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

We claim:

1. A storage card adapter usable with storage cards for insertion into a drive bay, the storage card adapter comprising:
    a carrier frame having an envelope compatible with the drive bay and configured to receive a printed circuit board, the carrier frame comprising:
        a first frame end side and a second frame end side opposite the first frame end side; and
        a cam located proximate the second frame end side, the cam including a recess and a mating ramp within the recess;
    a cover pivotably attached with the carrier frame, the cover comprising:
        a first cover end side and a second cover end side, wherein the first cover end side is pivotably attached with the first frame end side of the carrier frame;
        an aperture located proximate the second cover end side; and
    a compression latch comprising:
        an elongated lever; and
        a shaft extending perpendicularly from one end of the elongated lever and having an engagement ramp at a distal end;
        wherein the shaft extends through the aperture and the engagement ramp mates with the mating ramp when the elongated lever is pivoted about the shaft to thereby compress together the cover and the carrier frame.

2. The storage card adapter of claim 1, wherein the elongated lever is aligned in parallel with the second cover end side of the cover when the shaft is inserted into the recess in an unlatched position and is pivoted approximately 180° in order to engage the engagement ramp with the mating ramp and move to a latched position.

3. The storage card adapter of claim 1, wherein the cover further comprises a spring latch configured to lock the elongated lever in place when the elongated lever is moved to a latched position.

4. The storage card adapter of claim 3, wherein the spring latch is positioned on an exterior surface of the cover and includes a recess configured to receive the elongated lever and a release tab configured to release the elongated lever from the recess when depressed.

5. The storage card adapter of claim 1, wherein all components of the storage card adapter are dimensioned such that at least 100 lbs of compressive force is applied to a storage card sandwiched between two thermal pads housed within the storage card adapter when the compression latch is moved to a latched position.

6. The storage card adapter of claim 1, wherein the cover is configured to pivot approximately 180° relative to the first frame end side of the carrier frame.

7. The storage card adapter of claim 6, wherein the cover includes a stop pedestal to prevent the cover from pivoting more than approximately 180° relative to the first frame end side of the carrier frame.

8. The storage card adapter of claim 1, wherein at least one of the carrier frame and the cover include a heat sink configured to thermally communicate with a storage card when sandwiched between the carrier frame and the cover.

9. The storage card adapter of claim 1, wherein the carrier frame, the cover and the compression latch are each made from die cast aluminum.

10. The storage card adapter of claim 1, wherein the cover comprises:
    a first lateral cover side and a second lateral cover side opposite the first lateral cover side; and
    a plurality of heat fins on an interior side of the cover proximate both the first lateral side and the second lateral side.

11. The storage card adapter of claim 1, wherein the carrier frame comprises:
    a first lateral frame side and a second lateral frame side opposite the first lateral frame side; and
    a flanged storage card adapter guide at both the first lateral frame side and the second lateral frame side.

12. The storage card adapter of claim 1, wherein the aperture is centered along the length of the second cover end side and the cam is centered along the length of the second frame end side.

13. The storage card adapter of claim 1, wherein:
    the carrier frame includes two cams, one located proximate each corner of the second frame end side; and the cover includes two apertures, one located proximate each corner of the second cover end side, and two compression latches, one inserted in each aperture.

14. The storage card adapter of claim 1, wherein:
the cover includes a plurality of clamping posts extending from an interior surface of the cover;
and the carrier frame includes a plurality of guide posts extending from the interior surface of the carrier frame, the number of guide posts corresponding to the number of clamping posts;
wherein each guide post is configured to receive a corresponding clamping post when the cover
is pivoted to enclose the interior of the storage card adapter; and
wherein the guide posts and clamping posts are positioned such that a terminal end of a storage
card housed within the storage card adapter is clamped between the guide post and the clamping post.

15. The storage card adapter of claim 14, wherein the height of the guide posts and the clamping posts is configured to prevent over-compression of the storage card sandwiched between thermal pads housed within the storage card adapter when the compression latch is moved to a latched position.

16. A storage card adapter usable with storage cards for insertion into a drive bay, the storage card adapter comprising:
a carrier frame having an envelope compatible with the drive bay and configured to receive a printed circuit board, the carrier frame comprising:
a first frame end side and a second frame end side opposite the first frame end side; and
a hook proximate the second frame end side;
a cover pivotably attached with the carrier frame, the cover comprising:
a first cover end side and a second cover end side, wherein the first cover end side is pivotably attached with the first cover end side of the carrier frame; and
a latch proximate the second cover end side, the latch configured to engage with the hook and thereby compress the cover against the carrier frame, wherein the hook and latch are dimensioned such that at least 100 lbs of compressive force is applied to an M.2 card sandwiched between two thermal pads housed within the storage card adapter when the latch is engaged with the hook.

17. The storage card adapter of claim 16, wherein the carrier frame and the cover are each made from die cast aluminum.

18. The storage card adapter of claim 16, wherein the cover is configured to pivot 180° about the first frame end side of the carrier frame.

19. The storage card adapter of claim 18, wherein the cover includes a stop pedestal to prevent the cover from pivoting more than 180° about the first frame end side of the carrier frame.

20. The storage card adapter of claim 16, wherein the latch includes a release tab configured to release the latch from the hook when depressed.

* * * * *